United States Patent
Nishiura et al.

(10) Patent No.: US 6,343,733 B1
(45) Date of Patent: Feb. 5, 2002

(54) WIRE BONDING METHOD

(75) Inventors: Shinichi Nishiura, Fussa; Tooru Mochida, Higashiyamato, both of (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 0 days.

(21) Appl. No.: 09/339,311

(22) Filed: Jun. 23, 1999

(30) Foreign Application Priority Data

Jun. 23, 1998 (JP) .......................................... 10-176414

(51) Int. Cl.⁷ .......................... H01L 21/60; H01L 21/44
(52) U.S. Cl. ...................... 228/180.5; 228/4.5; 438/617
(58) Field of Search ............................... 228/180.5, 4.5, 228/102.111, 110.1, 1.1; 438/617, 612, 214, 613, 615

(56) References Cited

U.S. PATENT DOCUMENTS 5,967,401 A * 10/1999 Nishiura et al. ......... 228/180.5
5,989,995 A * 10/1999 Nishiura et al. ............ 438/617

FOREIGN PATENT DOCUMENTS

JP   H4-318943    11/1992
JP   H5-60657     9/1993

* cited by examiner

*Primary Examiner*—Tom Dunn
*Assistant Examiner*—Colleen Cooke
(74) *Attorney, Agent, or Firm*—Koda & Androlia

(57) ABSTRACT

A wire bonding method in which first and second bonding points are connected by a wire comprising the steps of: connecting the wire that passes through a capillary to a first bonding point, raising the capillary and performing a reverse operation so as to move the capillary in the opposite direction from the second bonding point, raising and moving the capillary toward the second bonding point and then lowering the capillary slightly, raising the capillary and performing at least once another reverse operation so as to move the capillary in the opposite direction from the second bonding point, and raising and then moving the capillary toward the second bonding point and connecting the wire to the second bonding point; thus forming a stable wire loop that has a high shape retention strength.

2 Claims, 4 Drawing Sheets

WIRE BONDING METHOD

BACKGROUND OF THE INVENTION

1. Field of the Invention

The present invention relates to a wire bonding method in which a first bonding point and a second bonding point are connected by a wire, and more particularly to a wire loop formation method in wire bonding.

2. Prior Art

As seen from FIGS. 4(a) and 4(b), in a semiconductor device assembly process, a pad 2a (first bonding point) on a semiconductor chip 2 mounted on a lead frame 1 and a lead 1a (second bonding point) on the lead frame 1 are connected by a wire 3. FIG. 4(a) shows a connected wire shaped in a trapezoidal loop, and FIG. 4(b) shows a connected wire shaped in a triangular loop. Wire loop formation methods of these types are disclosed, for example, in Japanese Patent Application Publication (Kokoku) No.H5-60657 and Japanese Patent Application Laid-Open (Kokai) No. H4-318943.

The trapezoidal loop shown in FIG. 4(a) is formed by the process shown in FIG. 5.

In step (a), with a damper (not shown) which holds the wire 3 opened, the capillary 4 is lowered, so that a ball formed on the tip end of the wire is bonded to the first bonding point A, after which the capillary 4 is raised in substantially vertical direction to point B, and the wire 3 is delivered. Next, in step (b), the capillary 4 is caused to move horizontally to point C in the opposite direction from the second bonding point G. Generally, such movement of the capillary 4 in the opposite direction from the second bonding point G is called a "reverse operation". As a result of the reverse operation, the wire 3 assumes a shape that is inclined from point A to point C, and a kink 3a is formed in a portion of the wire 3. The wire 3 delivered in this process from point A to point C forms the neck height part 31 shown in FIG. 4(a).

Thereafter, in step (c) in FIG. 5, the capillary 4 is raised in substantially vertical direction to point D, and the wire 3 is delivered. Afterward, in step (d), the capillary 4 is again caused to move horizontally to point E in the opposite direction from the second bonding point G. In other words, a second reverse operation is performed. As a result, the wire 3 assumes a shape that is inclined from point C to point E, and another kink 3b is formed in a portion of the wire 3. This wire 3 delivered from point C to point E forms the trapezoidal length part 32 shown in FIG. 4(a).

Next, in step (e) of FIG. 5, the capillary 4 is raised in substantially vertical direction to point F, and an amount of wire 3 corresponding to the inclined portion 33 shown in FIG. 4(a) is delivered. Afterward, the damper (not shown) is closed. When the damper is closed, no wire 3 is delivered even if the capillary 4 subsequently is moved. Next, in steps (f) and (g), the capillary 4 is positioned at the second bonding point G by being caused to perform a circular-arc motion or by being lowered after being caused to perform a circular-arc motion, and the wire 3 is bonded to the second bonding point G.

On the other hand, the triangular loop shown in FIG. 4(b) is formed by the process shown in FIG. 6. Since this triangular loop is a loop in which the trapezoidal length portion 32 of the trapezoidal loop is not formed, the second reverse operation taken in step (d) of FIG. 5 is not performed. Accordingly, the steps (c), (d) and (e) in FIG. 5 are reduced to only the step (c) in FIG. 6. In other words, the steps (a) and (b) in FIG. 6 are the same as the steps (a) and (b) of FIG. 5; and after the first reverse operation in step (b) in FIG. 6, the capillary 4 is raised in step (c) in substantially vertical direction to point F and the wire 3 is delivered. Afterward, the capillary 4 performs the operations of steps (d) and (e), which are similar to the operations in steps (f) and (g) of FIG. 5, and the wire 3 is bonded to the second bonding point G.

As described above, the triangular loop formation process shown in FIG. 6 has advantages. The loop formation can be accomplished by a simpler process than the trapezoidal loop formation process shown in FIG. 5, so that loop formation can be accomplished in a shorter time.

However, in cases where the (vertical) height difference between the first bonding point A and the second bonding point G is large, or in cases where the first bonding point A and the end portion of the semiconductor chip 2 are (horizontally) widely separated, the wire 3 tends to contact the semiconductor chip 2 if the wire has a triangular wire loop shape shown in FIG. 4(b). In such cases, the trapezoidal wire loop shape shown in FIG. 4(a) is used so that contact between the wire 3 and the semiconductor chip 2 is prevented.

In the trapezoidal loop formation process shown in FIG. 5, the first reverse operation in step (b) is performed with the capillary 4 in a position that is close to the height of the first bonding point A. Accordingly, a comparatively strong kink 3a can easily be formed. However, the second reverse operation in step (d) is performed with the capillary 4 in a high position away from the first bonding point A. Accordingly, the kink 3b is difficult to form and is unstable. As a result, the area of the kink 3b shown in FIG. 4(a) is unstable, the shape retention strength of the wire loop is weak, and the height of the kink 3b is not aligned with the height of the kink 3a, forming an end-raised or end-lowered loop. Furthermore, if the shape retention strength of the portion in the vicinity of the kink 3b is weak, the bonded wire bends when pressure from the outside is applied to the wire. For example, wire bending tends to occur as a result of external forces such as shocks caused by capillary contact or ultrasonic oscillation during bonding to the second bonding point G, vibration of the wire 3, or mold flow caused by injection of the molding material during molding.

SUMMARY OF THE INVENTION

Accordingly, the object of the present invention is to solve the problem of trapezoidal loops, and the main object of the present invention is to provide a wire bonding method which forms a stable wire loop shape and a wire loop shape which has a high shape retention strength.

The above objects are accomplished by unique steps of the present invention taken for a wire bonding method in which a first bonding point and a second bonding point are connected by a wire that passes through a capillary; and in the present invention is involved: a step in which the tip end of a wire is connected to the first bonding point, a step in which a capillary is raised to deliver the wire and a first reverse operation is performed so that the capillary is moved in the direction opposite from the second bonding point; a step in which the capillary is raised to deliver the wire, caused to move toward the second bonding point and then lowered slightly; a step in which the capillary is raised to deliver the wire and a second reverse operation is performed so that the capillary is moved in the opposite direction from the second bonding point; and a step in which the capillary is raised to deliver the wire, after which the capillary is moved toward the second bonding point and the wire is connected to the second bonding point.

The above described method may include steps to slightly lower the capillary after the reverse operations.

DETAILED DESCRIPTION OF THE PREFERRED EMBODIMENTS

Figure 4A:
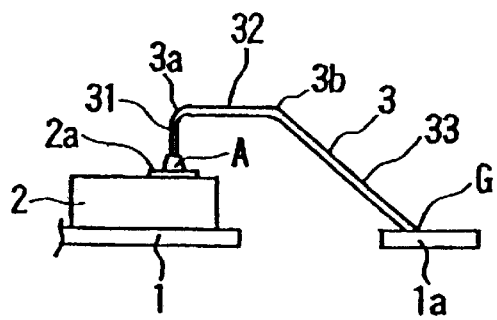
FIG. 4(a) shows the wire loop shape of a conventional trapezoidal loop.
Figure 4B:
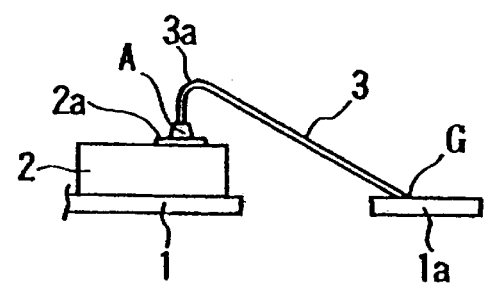
FIG. 4(b) shows the wire loop shape of a conventional triangular loop.
Figure 6:
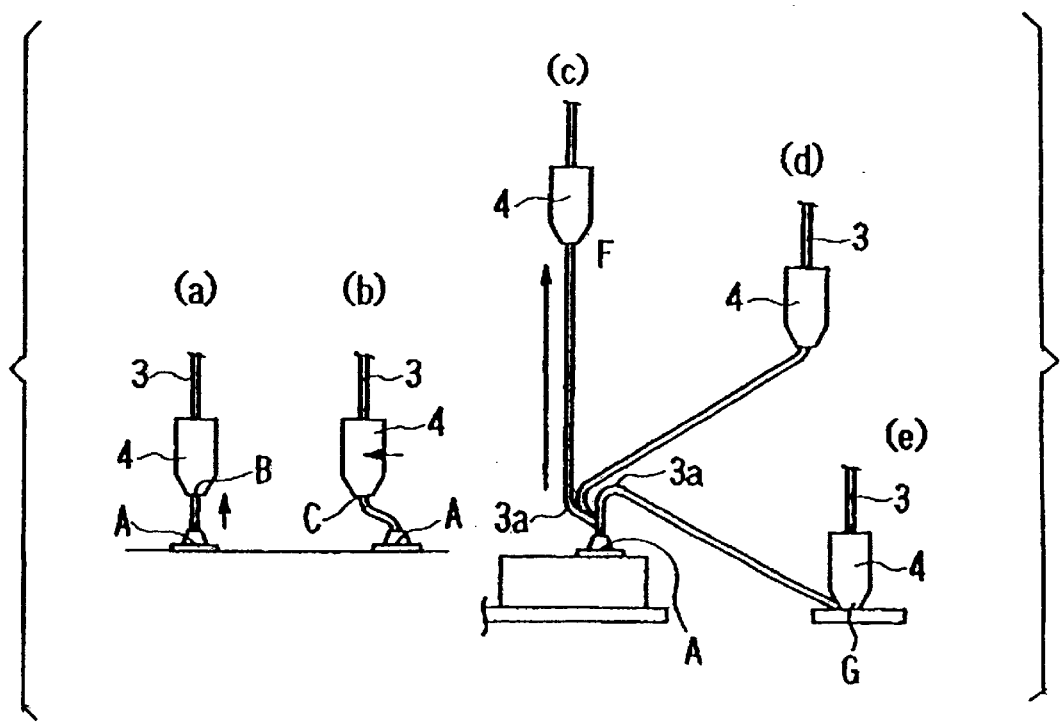
FIG. 6 shows the steps (a) through (g) for forming the triangular loop shown in FIG. 4(b) by the movement of the capillary.

One embodiment of the present invention will be described with reference to FIGS. 1 and 2. Furthermore, members and elements which are the same as in FIGS. 4(a) and 5 or correspond to those in FIGS. 4(a) and 5 will be labeled with the same reference symbols.

Figure 1:
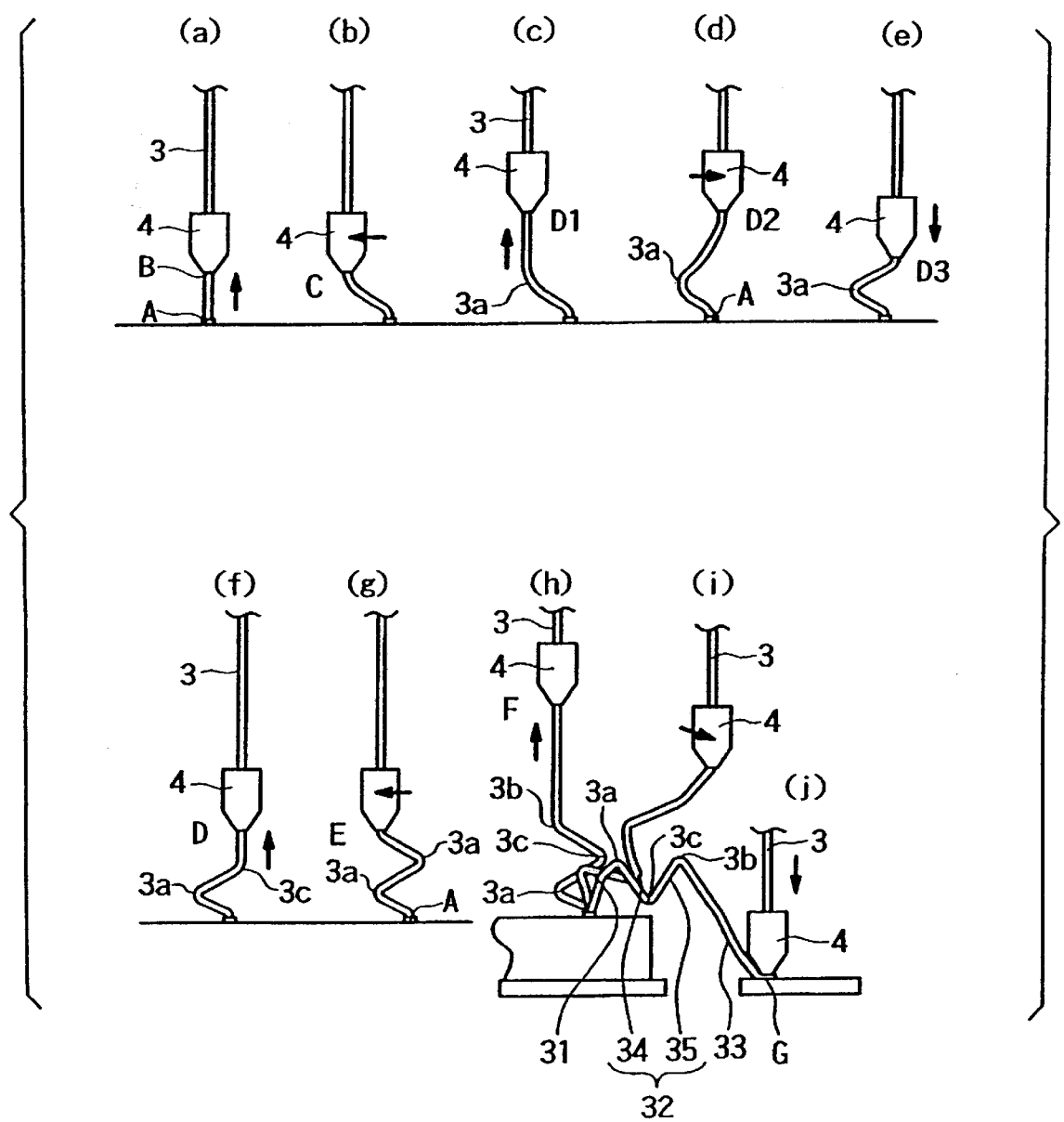
FIG. 1 illustrates one embodiment of the wire bonding method according to the present invention, showing the wire shapes caused by movement of the capillary during the steps (a) through (j)
Figure 2:
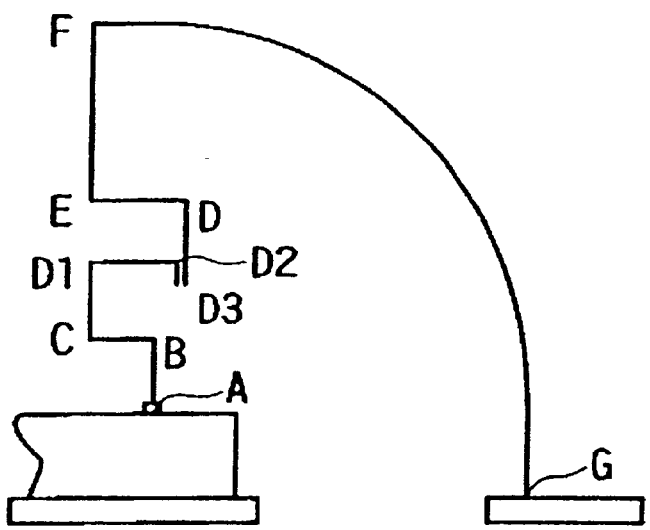
FIG. 2 is an explanatory diagram which shows the track of the capillary in FIG. 1.
Figure 5:
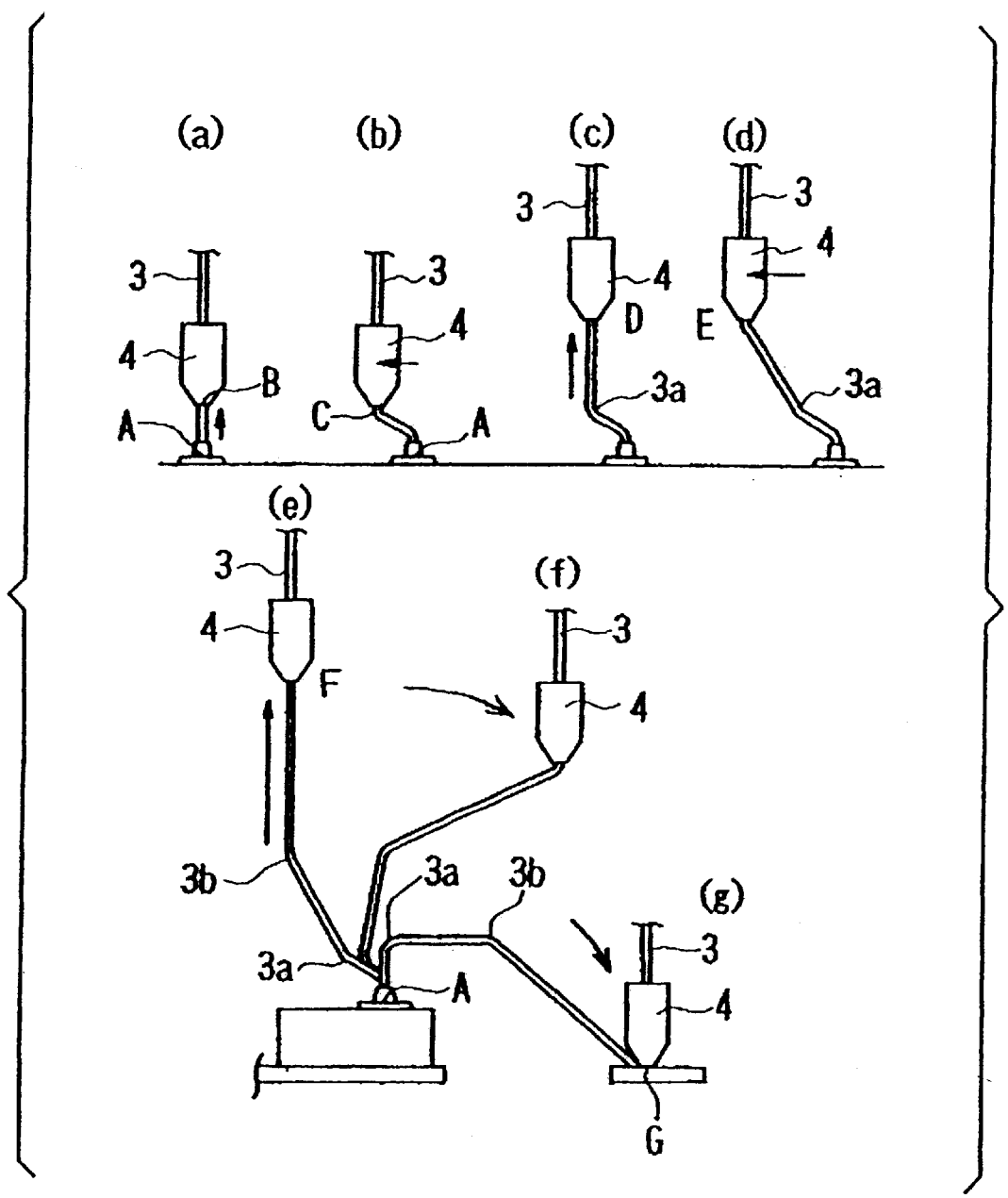
FIG. 5 shows the steps (a) through (g) for forming the trapezoidal loop shown in FIG. 4(a) by the movement of the capillary.

In the present embodiment, steps (c) through (e) in FIG. 5 are changed to steps (c) through (h) shown in FIG. 1. The remaining steps are the same as the steps shown in FIG. 5. In other words, the steps (a), (b), (i) and (j) of FIG. 1 correspond to the steps (a), (b), (f) and (g) of FIG. 5.

First, the steps (a) and (b) in FIG. 1, which are the same as in a conventional method, will be described.

In step (a), the capillary 4 through which a wire passes is lowered with a damper (not shown) which holds the wire 3 in an open state, and a ball (not shown) formed on the tip end of the wire 3 is bonded to the first bonding point A, after which the capillary 4 is raised in substantially vertical direction to point B, delivering the wire 3. Next, in step (b), a first reverse operation is performed, and the capillary 4 is caused to move horizontally to point C in the opposite direction from the second bonding point G. As a result, a kink 3a is formed in a portion of the wire 3. The wire 3 delivered when the capillary 4 is moved from point A to point C will form the neck height part 31 shown in step (i) which will be described below.

Next, the steps characterizing the present embodiment will be described.

In step (c), the capillary 4 is raised in substantially vertical direction to point D1, which is more or less halfway between point C and point D (see step (f) and step (c) in FIG. 5), and the wire 3 is delivered. Afterward, in step (d), the capillary 4 is moved to point D2 in the direction toward the second bonding point G. Then, in step (e), the capillary is lowered slightly to point D3. Next, in step (f), the capillary 4 is raised in substantially vertical direction to point D, and the wire 3 is delivered.

A kink 3c is formed in the wire 3 in the steps (d) through (f). Especially as a result of the steps (d) and (e), the kink 3c is strongly formed and fixed. Furthermore, the position of the kink 3c is more stable, and a wire loop shape with a high shape retention strength is obtained. In the above steps, the length of wire delivered in the operation from point D1 to point D2 (i. e., the length from the kink 3a to the kink 3c) forms a first lateral wire part 34.

Next, in step (g), the capillary 4 is moved in the opposite direction from the second bonding point G. In other words, a second reverse operation is performed, and the capillary 4 is moved horizontally to point E. As a result of this operation from point C to point E, another kink 3b is formed in the wire 3. The wire 3 delivered in this case forms the second lateral wire part 35 shown in step (j). Thereafter, in step (h), the capillary 4 is raised in substantially vertical direction to point F, and an amount of wire 3 corresponding to the inclined portion 33 shown in step (j) is delivered. Afterward, the damper (not shown) is closed. When the damper is closed, the wire 3 is not delivered even if the capillary 4 is subsequently moved.

After the step (g), as shown in steps (i) and (j), the capillary 4 is positioned at the second bonding point G by being caused to perform a circular-arc motion or by being lowered after being caused to perform a circular-arc motion, and the wire 3 is bonded to the second bonding point G in the same manner as in conventional methods.

Since the operation from point F to the second bonding point G has no direct connection with the gist of the present invention, it goes without saying that it would also be possible to perform an operation similar to the operations of the conventional methods or to perform various other operations.

As seen from the above, the second reverse operation in step (g) is not merely performed after the capillary 4 has been raised in step (c) but is instead performed after the capillary 4 is moved temporarily in the direction of the second bonding point G in step (d), lowered slightly in step (e), and then raised in step (f), thus forming the kink 3c. As a result, a strong kink 3c is formed in the trapezoidal length portion 32; and with the presence of this kink 3c, the trapezoidal length portion 32 assumes a shape that is bowed downward. Accordingly, a kink 3b that is stronger than the kink by the conventional methods is formed, the position of the kink 3b is stabilized, and a wire loop shape with a high shape retention strength is formed.

Figure 3:
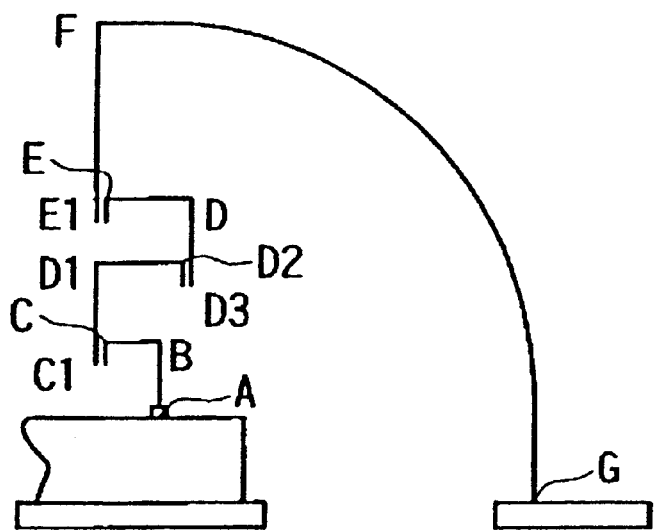
FIG. 3 is an explanatory diagram which shows the track of the capillary in another embodiment of the present invention.

FIG. 3 illustrates another embodiment of the present invention. In this embodiment, the capillary 4 is lowered slightly from point C to point C1 after the capillary 4 performs a reverse operation to be moved from point B to point C. In addition, the capillary 4 is once again lowered slightly from point E to point E1 after the capillary performs another reverse operation to be moved from point D to point E.

By lowering the capillary 4 slightly from point C to point C1, the kink 3a shown in steps (c) through (j) is formed more strongly; and by lowering the capillary 4 slightly from point E to point E1, the kink 3b shown in steps (h) through (j) is formed more strongly. In other words, in the present embodiment, all of the kinks 3a, 3b and 3c are strongly formed, and the wire loop shape and shape retention strength are improved even more than the embodiment shown in FIGS. 1 and 2.

When the trapezoidal length portion 32 is designed to be extremely long, the process in which the capillary 4 is moved from point D3 to point E via point D can be performed a multiple number of times, not being limited to one time as in the described embodiments.

As seen from the above, the present invention takes:

a step in which the tip end of a wire is connected to a first bonding point, a step in which a capillary, through which the wire passes, is raised to deliver the wire and a first reverse operation is performed so that the capillary is caused to move in the direction opposite from a second bonding point, a step in which the capillary is raised to deliver the wire, caused to move toward the second bonding point and then lowered slightly, a step in which the capillary is raised to deliver the wire and a second reverse operation is performed at least once so that the capillary is caused to move in the opposite direction from the second bonding point, and a step in which the capillary is raised to deliver the wire, after which the capillary is moved toward the second bonding point and the wire is connected to the second bonding point. Accordingly, a stable wire loop shape and a wire loop shape which has a high shape retention strength is obtained.

Accordingly, a stable loop shape can be obtained not only in the case of short loops with a short wiring distance but also in the case of long loops with a long wiring distance. Furthermore, since a loop which has a high shape retention strength with respect to pressure applied from the outside is formed, wire is prevented from bending even when pressure from the outside is applied. In other words, the bonded wire has a high shock-absorbing capacity with respect to external forces such as shocks caused by contact with the capillary or ultrasonic vibration when the wire is bonded to the second bonding point, vibration of the wire, and mold flow caused by injection of the molding material during molding. Wire bending is assuredly prevented.

What is claimed is:

1. A wire bonding method in which a first bonding point and a second bonding point are connected by a wire that passes through a capillary, comprising the steps of:

connecting a tip end of the wire to a first bonding point, raising a capillary to deliver the wire, performing a first reverse operation in which the capillary is moved in a direction opposite from the second bonding point, raising the capillary to deliver the wire, moving the capillary toward the second bonding point to form a first kink in said wire, then lowering the capillary a predetermined amount to make a stronger first kink, raising the capillary to deliver the wire, performing a second reverse operation in which the capillary is caused to move in an opposite direction from the second bonding point, raising the capillary to deliver the wire, then moving the capillary toward the second bonding point to form a second kink in said wire, raising the capillary to deliver the wire, and connecting the wire to the second bonding point.

2. The wire bonding method according to claim 1, further comprising steps of slightly lowering the capillary after each of the first and second reverse operations.

* * * * *